United States Patent Office 3,595,684

Patented July 27, 1971

3,595,684
ELECTROLESS COPPER PLATING

John L. Morico, North Haven, and Howard W. Pender, Wolcott, Conn., assignors to Enthone, Incorporated, New Haven, Conn.

No Drawing. Filed June 27, 1968, Ser. No. 740,486
Int. Cl. B44d *1/092*; C23c *3/02*
U.S. Cl. 117—47 14 Claims

ABSTRACT OF THE DISCLOSURE

A chemical reduction copper plating solution of improved stability comprising copper ions, formaldehyde as reducing agent for the copper ions, Rochelle salt is complexing agent for the copper ions, sodium hydroxide or potassium hydroxide, and additional methanol in amount to provide an excess of methanol sufficient to shift the equilibrium of a Cannizzaro side reaction in the direction of the reactants, the solution being free of an amine such as triethanolamine. By reason of (1) the excess of methanol sufficient to shift the equilibrium of the Cannizzaro reaction to the left, (2) Rochelle salt as complexer for the ionic copper and which appears to form a weaker complex with the ionic copper than EDTA, and (3) the absence of an amine such as triethanolamine or diethylamine from the solution and which is present in prior art electroless copper solutions, electroless copper plating solutions are provided of considerably longer life than those of the prior art and which effectively plate copper at materially lower solution temperatures than the temperatures required by the prior art electroless copper plating solutions.

BACKGROUND OF THE INVENTION

(1) Field of the invention

This invention relates to electroless copper plating, and more particularly to new and improved chemical reduction copper plating solutions of higher stability than those of the prior art and capable of effectively plating copper at solution temperatures materially lower than those of the prior art. Additionally this invention relates to a method for electrolessly plating copper involving the use of the chemical reduction copper plating solution herein, and to new compositions and additives especially well suited for use in forming the chemical reduction copper plating solutions herein and for replenishing ingredients thereof.

(2) Description of the prior art

Electroless copper plating is of considerable importance commercially. A principal application is in the electronics industry, for instance in the production of printed circuits. In the latter use, electroless copper is employed to render plastic surfaces electrically conductive, especially in the manufacture of "plated-through hole" printed circuit boards. Other applications in the electronics industry take advantage of the high electrical conductivity of thin deposits of electroless copper, as in the coating of epoxy surfaces to produce additive type printed circuits and the plating of magnetic tape.

Commercial formulations of electroless copper plating compositions are usually supplied as two solutions or powders with the copper salt in one solution or powder and the reducing agent, usually formaldehyde, in the other. The two solutions or powders and water are mixed together just prior to use, whereby the reduction of the copper ions commences shortly thereafter to plate out metallic copper. In certain commercial formulations, in the case of the solutions, both the copper salt and reducing agent may be in one of the solutions with the pH of the solution maintained low enough and on the acid side to prevent the redox reaction, and the other solution, which is an alkaline solution, will contain the alkali and complexing agent.

The prior art electroless copper plating solutions are characterized by being very unstable compositions and undergoing a spontaneous decomposition after only a short period of use, which is a matter of hours. The copper precipitates out of the solution and metallic copper particles can be usually visually observed at the bottom of the tank or container holding the solution. The decomposed solutions are usually not regenerable or recoverable, and must be discarded.

Among the reactions occurring during electroless or chemical reduction copper plating utilizing a commonly used prior electroless copper plating solution containing copper ions, formaldehyde, sodium hydroxide, a complexer for the ionic copper and sodium carbonate is a side reaction, which is the Cannizzaro reaction involving the reaction of formaldehyde and sodium hydroxide to form sodium formate and methanol. This Cannizzaro reaction, which is a reversible reaction, is in accordance with the following equation:

$$2HCHO + \text{Alkali metal } OH \rightleftarrows HCOO \text{ Alkali metal} + CH_3OH$$

Due to the formation of the sodium foramate, the reduction of the ionic copper during the electroless copper plating stops at the cuprous oxide state which results in "seeding out" or precipitation of the copper and spontaneous premature decomposition of the plating solution or bath. The Cannizzaro side reaction will also occur when another alkali metal hydroxide for instance potassium hydroxide is utilized in the electroless copper plating solution instead of the sodium hydroxide. A plurality of stabilizers or inhibitors were utilized in certan pror art electroless copper plating solutions, which stabilizers were ntended to inhibit in some manner the spontaneous and premature reduction of the metal ions, or the "seeding out" or spontaneous decomposition of the copper plating solutions due to the metal particles after their reduction from the ionic state. However it appears the prior art never appreciated or recognized the instability problem raised by certain side reactions occurring during chemical reduction copper plating and specifically the Cannizzaro reaction involving the reaction of formaldehyde and sodium hydroxide and, for the most part, the prior art did not bother to prevent or inhibit the side reaction.

One electroless copper plating solution known in the prior art and which is stated to be of improved stability over the extremely unstable prior art electroless copper plating solutions is an aqueous solution of copper sulfate pentahydrate, EDTA, methanol or ethanol, an amine such as triethanolamine or diethylamine, and trisodium phosphate. Such plating solution is disclosed and claimed in U.S. Patent 3,307,972. Although we found this last-mentioned electroless plating solution to be satisfactory in certain respects, there was still considerable room for improvement from the standpoint of stability of the solution and the capability of electrolessly plating copper at lower temperatures down to about 70° F.–75° F., which are common room temperatures, and at which lower temperatures such prior art electroless copper plating solution was incapable of satisfactorily plating copper. The inability of such prior art electroless copper plating solution to satisfactorily plate copper at such room temperatures was concluded to be due to the ionic copper being complexed too tightly by the EDTA. Further, the relative instability of the copper plating solution of Patent 3,307,-972 at elevated temperatures up to about 140° F. was attributed to the presence of the amine as a constituent of the solution.

SUMMARY OF THE INVENTION

In accordance with the present invention, we have found that chemical reduction copper plating solutions are provided of a considerably higher stability and considerably longer life than the prior art electroless copper plating solutions previously referred to herein, and which are capable of plating copper with good results at solution temperatures materially lower than the solution temperature required by the prior art electroless solutions for satisfactorily plating copper. The new and improved chemical reduction copper plating solutions herein are attained by the combination of (1) providing in the electroless copper plating solution an excess of methanol sufficient to shift or displace the equilibrium of the reversible Cannizzaro reaction to the left, i.e. in the direction of the reactants; (2) Rochelle salt as complexing agent for the ionic copper; and (3) the omission of amine such as triethanolamine or diethylamine from the solution. All three of the above conditions must be observed, and the elimination or nonobservance of any one of the three will not result in the considerably improved chemical reduction copper plating solution of this invention.

In its broader aspects, the chemical reduction aqueous copper plating solution herein comprises copper ions, ordinarily supplied as a solution-compatible copper salt, formaldehyde as reducing agent for the copper ions, the Rochelle salt as complexer for the ionic copper, sodium hydroxide or potassium hydroxide, and the methanol in amount sufficient to provide the excess thereof specified supra, i.e. an excess sufficient to shift the equilibrium of the reversible Cannizzaro reaction to the left, the solution being free of an amine.

This invention also comprehends compositions or concentrates and additives especially well suited for use in forming the high stability chemical reduction copper plating solutions herein and for replenishing ingredients of the copper plating solutions respectively, and in their broader aspects, each comprising a mixture of Rochelle salt, methanol and an alkali metal hydroxide, such as sodium hydroxide or potassium hydroxide. Water is also preferably an ingredient of such compositions. Further, an alkali metal carbonate, e.g. sodium carbonate or potassium carbonate, is also preferably an ingredient of such composition.

Exemplary of the water-soluble copper salts for supplying the copper ions to the plating solution are copper sulfate, copper nitrate and copper chloride.

Instead of formaldehyde per se, compounds or materials providing formaldehyde in the electroless copper plating under the conditions of electroless copper plating are also utilizable herein. Exemplary of such compounds are paraformaldehyde and trioxane. Accordingly the term "formaldehyde" is used in a broad sense in the appended claims to include not only formaldehyde per se, but also compounds or materials which decompose or otherwise react in the electroless copper plating solution under the conditions of the electroless copper plating to provide formaldehyde in the solution, for example paraformaldehyde and trioxane.

DESCRIPTION OF THE PREFERRED EMBODIMENTS

The pH of the electroless copper plating solutions herein is preferably 10–13, more preferably about 11.5– 12.5. The pH is maintained within such ranges by addition of alkali, preferably an alkali metal hydroxide, e.g. NaOH or KOH.

Preferred temperttures of the plating solutions of this invention are in the range from about 70° F.–140° F. The plating solutions herein give good results in electrolessly plating copper at room temperatures of between about 70° F. and about 75° F. as well as at higher temperatures within the 70° F.–140° F. range.

The excess of methanol utilized is preferably about a 5% or greater excess over the amount thereof required to stoichiometrically react with the alkali metal formate to form formaldehyde and alkali metal hydroxide, more preferably a 5% to 10% excess of methanol over such stoichiometric amount.

A preferred electroless copper plating solution herein is the following:

Copper salt—20–30 g./l.
Rochelle salt—40–60 g./l.
Alkali metal hydroxide—10–20 g./l.
Formaldehyde (37%)—100–150 ml./l.
Methanol—from about 40–250 g./l.

Although amounts of methanol slightly below 40 g./l. and to a small extent above 250 g./l. are utilizable herein, below 40 g./l. should be avoided due to lack of stability of the solution. With amounts of methanol much above 250 g./l., a solubility problem is encountered.

In addition to methanol of commerce or industry, a mixture of methanol and ethanol, commonly known as denatured alcohol, is utilizable with satisfactory results in the compositions of this invention.

The surfaces capable of being copper plated with the plating solutions and baths herein are both nonmetallic and metallic surfaces. Nonmetallic surfaces platable herein are exemplified by organic plastic surfaces, e.g. surfaces of acrylonitrile-butadiene-styrene terpolymer and epoxy resins and the metallic surfaces are exemplified by ferrous metal, e.g. steel, iron and nickel surfaces.

The metallic surfaces, for instance steel, iron or nickel, prior to being plated with copper by this invention, if not already in catalytically activated condition for the plating, are subjected to a conventional cleaning and pickling. The metal substrates are then catalysts for the deposition of copper from the solutions herein by the redox reaction. Further, the metallic surface, when immersed in the electroless copper solution, may receive a flash deposit of metallic copper by galvanic displacement. This immersion deposit serves as a catalytic surface for the further build up of the copper deposit on the surface in the electroless plating solution.

Prior to plating the nonmetallic surfaces, for instance the plastic surfaces, such surfaces if not already clean are cleaned by immersion in a conventional nonsilicated alkaline cleaner solution. The plastic surface or surfaces destined to be electrolessly copper plated are then converted from a hydrophobic state to a hydrophilic state wherein the surfaces are readily receptive to the aqueous solutions of the chemical reduction copper plating process or cycle. The conversion of the hydrophobic plastic surfaces to hydrophilic surfaces is preferably effected by contacting the hydrophobic surface with, usually by immersing such surface in, a conditioning solution comprising an aqueous acid solution containing sulfuric acid and chromic acid and which may also contain phosphate ions. The conversion of the hydrophobic plastic surfaces to hydrophilic surfaces can also be effected mechanically by roughening the plastic surface, for instance by sanding, sand blasting or abrading the hydrophobic plastic surface. When this mechanical conversion is employed, the prior chemical cleaning of dirty plastic surfaces may be omitted as the mechanical roughening also effects a cleaning of the plastic surface.

The conditioned nonmetallic surfaces are then activated in conventional manner, by contacting the plastic surface or surfaces to be plated with, usually by immersing the surface in, a sensitizer solution, preferably an aqueous acid solution containing stannous chloride, HCl and water, followed by water rinsing. The sensitized plastic surface is then contacted with an activator solution, preferably an aqueous acid solution containing noble metal ions, e.g. pallidium, gold or platinum ions, and exemplified by a solution containing palladium chloride, HCl and water.

The resulting redox reaction causes the noble metal ions to be reduced and the catalytic noble metal deposited on the nonmetallic surface. Alternatively, the activator solution is applied to the nonmetallic surface first followed by the sensitizer solution, with the same redox reaction occurring plating out the catalytic noble metal. If desired, the activator and sensitizer can be present together in the same activator solution with the activator catalytic metal present therein in colloidal suspension. Water rinsing of the surface follows its contacting with the activator solution.

The following testing was carried out:

A plurality of chemical reduction copper plating baths were prepared by mixing together the following Concentrate A, Concentrate B and deionized water in the volume ratio of 3:3:4 respectively, and to a volume of 400 ml in new polypropylene beakers

| Concentrate A: | Percent by weight |
|---|---|
| $H_2SO_4$ (analytic reagent grade) | 0.03 |
| HCHO (37% concentration) | 38.3 |
| $CuSO_4 \cdot 5H_2O$ | 7.1 |
| $H_2O$ | 54.57 |

| Concentrate B: | |
|---|---|
| Rochelle stalt | 15.90 |
| NaOH | 4.66 |
| $Na_2CO_3$ | 1.45 |
| $H_2O$ | 77.99 |

Except for two control baths to which no additive was added for evaluation as stabilizer, the following compounds were added to each plating bath one per bath for evaluation as stabilizers against bath decomposition by precipitation or seed out of ingredients of the bath.

| Additive compound: | Amount of additive compound added to bath |
|---|---|
| Sodium chloride, oz./gal. | 0.5, 1.0, 2.0 |
| Methanol, percent by volume | 2.0, 5.0, 7.5 |
| Thiourea, p.p.m. | 0.2, 0.5, 1.0, 1.25, 2.0, 2.5, 5.0 |
| None—control—2 baths. | |

An acrylonitrile-butadiene-styrene terpolymer panel of dimensions of 2¼" by 3¼" and a plurality of acrylonitrile-butadiene-styrene terpolymer salt shaker caps were electrolessly copper plated in each of the foregoing chemical reduction copper plating baths and using the following cycle:

(1) Cleaned in alkaline cleaner solution at solution temperature of 140° F. for 2 minutes.

(2) Cold water rinse.

(3) Immersed for 30 seconds in an aqueous solution containing, by weight, 86% of $NaHSO_4$, 12% of $NaHF_2$ and 2% of NaCl with the solution at room temperature.

(4) Cold water rinse.

(5) Immersed for 7 minutes in an aqueous acid conditioning solution containing, by weight, 27.5% of $H_2SO_4$ (66° Bé.), 27.5% of $CrO_3$ and 45% of $H_2O$ at solution temperature of 140° F.

(6) Cold water rinse, with such rinse repeated twice.

(7) Immersed for 3 minutes in an activator solution obtained by mixing a composition containing, by weight, 1.48% of HCl (analytic reagent grade), 0.42% of $PdCl_2$ and 98.10% of water with deionized water in the volume ratio of 1:15 respectively, at solution temperature of 140° F.

(8) Cold water rinse, with such rinse repeated once.

(9) Immersed in a solution containing, by weight, 1.61% of dimethylamine borane, 0.05% of NaOH and 98.44% of water.

(10) Cold water rinse.

(11) Immersed for 7 minutes in particular chemical reduction copper plating bath as aforesaid, with each bath at room temperature.

(12) Cold water rinse.

The coverage, appearance and adhesion of the copper plate was satisfactory from all plating baths with the exception of those panels and caps plated in the bath containing 5.0 p.p.m. thiourea. The bath containing 5.0 p.p.m. thiourea provided poor and incomplete coverage and a low degree of adhesion.

With respect stability of the baths, the following table shows the stability of each bath over periods of 24, 48 and 72 hours:

| Chemical reduction copper plating bath containing as stabilizer— | 24 hours | 48 hours | 72 hours |
|---|---|---|---|
| None—control | No seeding | Light seeding | Heavy seeding. |
| Do | do | do | Do. |
| Sodium chloride: | | | |
| 0.5 oz./gal | Light seeding | do | Do. |
| 1.0 oz./gal | Moderate seeding. | Complete seed-out. | Complete seed-out. |
| 2.0 oz./gal | Heavy seeding. | do | Do. |
| Methanol: | | | |
| 2.0% | No seeding | Light seeding | Light seeding. |
| 5.0% | do | No seeding | No seeding. |
| 7.5% | do | do | Do. |
| Thiourea: | | | |
| 0.2 p.p.m | Moderate seeding. | Complete seed-out. | Complete seed-out. |
| 0.5 p.p.m | do | do | Do. |
| 1.0 p.p.m | do | do | Do. |
| 1.25 p.p.m | do | Heavy seeding. | Do. |
| 2.0 p.p.m | Light seeding | Moderate seeding. | Heavy seeding. |
| 2.5 p.p.m | do | do | Moderate seeding. |
| 5.0 p.p.m | do | Light seeding | Light seeding. |

The considerable improvement in stability of the plating bath provided by the methanol additive, especially when when added in amounts of 5.0% and 7.5% by volume, over that provided by the other additives tested and the control baths with no additive utilized is readily shown by the data of the foregoing table. The improvement in bath stability provided by the methanol was attributed to the excess of methanol in the bath shifting the equilibrium of the reversible Cannizzaro reaction in the direction of the reactants formaldehyde and sodium hydroxide or potassium hydroxide. Consequently there was sufficient formaldehyde present to reduce the ionic copper to metallic copper, and the cessation of the reduction at the bath-insoluble cuprous oxide stage by the sodium formate with attendant seeding of the cuprous oxide was inhibited. In the foregoing table, the term "light seeding" means that some metallic copper particles are present at the bottom of the bath, although the bath is still of about the same blue coloration as it was at its formation; the term "moderate seeding" means that metallic copper particles are present on the walls of the container holding the bath and at the bottom of the bath in greater amount than in the "light seeding," and that the bath was of a lighter blue coloration than was the bath with the "light seeding but of a deeper blue coloration than was the bath with the "heavy seeding" hereafter described; the "heavy seeding" means that a relatively larger amount of metallic copper particles had precipitated out of the solution or bath, and that greater amounts of such copper particles were visible on the container walls and at the bottom of the bath, with the bath being pale blue in color; and the term "complete seed-out" means that all or virtually all of the copper had precipitated out of the bath as metallic copper particles, and the bath being colorless or virtually so as contrasted with its blue color when formed.

Additional tests were carried out as follows:

Two each of the following chemical reduction copper plating baths were prepared.

PRIOR ART PLATING BATH

Copper sulfate pentahydrate—25 g./l.
EDTA—100 g./l.
Trisodium phosphate—100 g./l.
Methanol—50 ml./l.
Triethanolamine—15 ml./l.
Formaldehyde (38%)—20 ml./l.

INVENTION PLATING BATH

A chemical reduction copper plating solution obtained by mixing together the following Concentrate A, Concentrate B and deionized water in the volume ratio of 3:3:4 respectively.

| Concentrate A: | Percent by weight |
|---|---|
| $H_2SO_4$ (analytical reagent grade) | 0.03 |
| HCHO (37% concentration) | 38.3 |
| $CuSO_4 \cdot 5H_2O$ | 7.1 |
| $H_2O$ | 54.57 |
| Concentrate B: | |
| Rochelle salt | 14.24 |
| NaOH | 4.21 |
| $Na_2CO_3$ | 1.29 |
| Methanol | 10.25 |
| $H_2O$ | 70.01 |

Four salt shaker caps of acrylonitrile-butadiene-styrene terpolymer (i.e. ABS) were electrolessly plated in each of the two sets of the Prior Plating Bath and Invention Plating Bath supra (a total of 4 baths) for a ten minute period. Two of the ABS caps were electrolessly plated in one each of the Prior Art Plating Bath and Invention Plating Bath supra each at a bath temperature of 74° F., and two of the ABS caps were electrolessly plated in one each of the prior Art Plating Bath and Invention Plating Bath supra each at a bath temperature of 140° F.

Prior to the electroless copper plating, all ABS salt shaker cups were treated by the following treatment cycle:

(1) Immersed for 6 minutes in a conditioning solution containing, by weight, 27.5% of $H_2SO_4$ (66° Bé.), 27.5% of $CrO_3$ and 45% of $H_2O$ at a solution temperature of 140° F.

(2) Cold water rinse, with such rinse repeated twice.

(3) Immersed for 3 minutes in an activator solution having a temperature of 140° F. and obtained by mixing an activator concentrate with deionized water in the volume ratio of 1:15 respectively, the activator concentrate containing, by weight, 1.48% of HCl (analytic reagent grade), 0.42% of $PdCl_2$ and 98.10% of $H_2O$.

(4) Cold water rinse, with such rinse repeated once.

(5) Immersed for 2 minutes in a solution containing, by weight, 1.61% of dimethylamine borane, 0.05% of NaOH and 98.44% of water, at room temperature of the solution. Cold water rinse with such rinse repeated once.

The results of such test runs with the electroless copper plating baths operated at a temperature of 74° F. were:

(A) Prior art plating bath at 74° F.—No discernible copper plating of any of the ABS caps in the ten minute plating time.

(B) Invention plating bath at 74° F.—Complete copper plating coverage of all ABS caps in 2–3 minutes.

Appearance of the copper plate was good on all ABS caps.

(C) Prior art plating bath at 140° F.—Unsatisfactory random spot coverage of copper on all ABS caps in the ten minute plating time.

(D) Invention plating bath at 140° F.—Complete copper plating coverage of all ABS caps during the first minute of plating. Appearance of the copper plate was good on all ABS caps.

In additional testing, a bath substantially identical to the "Prior Art Plating Bath" aforesaid was prepared except that the trisodium phosphate was entirely omitted from the bath. The pH of such bath without trisodium phosphate was found to be 9.2, and the pH was raised to 11.4 by addition of 10% of NaOH. A plurality of ABS salt shaker cups immersed in such trisodium phosphate-free bath at 74° F. and at 140° F. for ten minutes at each bath temperature resulted in no discernible copper plating of any of the ABS caps at the bath temperature of 74° F. and when the bath was at temperature of 140° F. It was evidenced from this testing and from the test results with the "(C) Prior Art Plating Bath at 140° F." previously set forth herein, that the deletion of trisodium phosphate from the "Prior Art Plating Bath" aforesaid did not improve the effectiveness of the bath at room temperature of the bath or at a bath temperature of 140° F.

The compositions or concentrates of this invention, which are especially well suited for use in forming the high stability chemical reduction copper plating solutions herein, preferably comprise a mixture of Rochelle salt, methanol, an alkali metal hydroxide, an alkali metal carbonate and water. Sodium hydroxide is the preferred alkali metal hydroxide and sodium carbonate the preferred alkali metal carbonate. Such composition or concentrate is adapted for mixing together with a composition or concentrate comprising a mixture of formaldehyde, a copper salt, e.g. $CuSO_4 \cdot 5H_2O$, sulfuric acid and water, and with water preferably in the volume ratio of 3:3:4 respectively, to form the high stability electroless copper plating bath herein. The proportions of ingredients of such compositions or concentrates of this invention are not especially critical and can be varied over wide ranges.

Preferably such composition contains the ingredients in proportions within the ranges hereafter set forth:

| | Percent by weight |
|---|---|
| Rochelle salt | About 10–about 18. |
| Alkali metal hydroxide | About 3–about 5. |
| Alkali metal carbonate | About 1–about 2. |
| Methanol | About 10–about 15. |
| Water | About 55–about 85. |

Such compositions, as well as the replenisher additive compositions or concentrates hereinafter disclosed, are preferably prepared by mixing together the Rochelle salt, alkali metal hydroxide, alkali metal carbonate and water to form an aqueous solution. The solution is filtered, and the methanol is then added to the solution, preferably with stirring or agitating of the solution.

One especially preferred composition or concentrate herein is the following:

| | Percent by weight |
|---|---|
| Rochelle salt | 14.24 |
| Sodium hydroxide (analytic reagent grade) | 4.21 |
| Soduim carbonate | 1.29 |
| Methanol | 10.25 |
| Distilled water | 70.01 |

This last-mentioned composition, when mixed together with a composition or concentrate of the following composition:

| | Percent by weight |
|---|---|
| HCHO (37%) | 38.30 |
| $CuSO_4.5H_2O$ | 7.10 |
| $H_2SO_4$ (analytic reagent grade) | 0.03 |
| $H_2O$ | 54.57 |

and water in the volume ratio of 3:3:4 respectively, results in the high stability electroless copper plating solution herein.

The replenisher additive compositions herein preferably comprise a mixture of Rochelle salt, methanol, an alkali metal hydroxide, preferably sodium hydroxide, an alkali metal carbonate, preferably sodium carbonate, and water. The proportions of ingredients of the replenisher additive are not especially critical and also can be varied over wide limits. Typically the replenisher additive composition contains the ingredients within the proportion ranges hereafter set forth:

| | Percent by weight |
|---|---|
| Rochelle salt | About 2– about 4. |
| Alkali metal hydroxide | About 7– about 11. |
| Alkali metal carbonate | About 1– about 2. |
| Methanol | About 20– about 25. |
| Water | About 60– about 80. |

The following additional tests were carried out to determine the effect of substituting EDTA for Rochelle salt in the chemical reduction copper plating bath:

The following chemical reduction copper plating baths were prepared. The Concentrate A used in preparing all baths contained, by weight, 0.03% of $H_2SO_4$ (analytic reagent grade), 38.3% of HCHO (37% concentration), 7.1% of $CuSO_4.5H_2O$ and 54.57% of water.

Control bath 1A.—A Concentrate B of the following composition, the Concentrate A, and deionized water were mixed together to form the bath in the volume ratio of 3:4:4 respectively.

| Concentrate B: | G./l. |
|---|---|
| Rochelle salt | 157.9 |
| NaOH | 46.8 |
| $Na_2CO_3$ | 14.4 |
| Methanol | 114.0 |
| Water | 778.5 |

EDTA—Containing bath 1.—A Concentrate B of the following composition, the Concentrate A, and deionized water were mixed together to form the bath in the volume ratio of 3:3:4 respectively.

| Concentrate B: | G./l. |
|---|---|
| EDTA | 300.0 |
| NaOH | 46.8 |
| $Na_2CO_3$ | 14.4 |
| Methanol | 114.0 |
| Water | 778.5 |

EDTA—Containing bath 2.—A Concentrate B of the following composition, the Concentrate A, and deionized water were mixed together to form the bath in the volume ratio of 3:3:4 respectively.

| Concentrate B: | G./l. |
|---|---|
| EDTA | 158.4 |
| NaOH | 46.8 |
| $Na_2CO_3$ | 14.4 |
| Methanol | 114.0 |
| Water | 778.5 |

EDTA—Containing bath 3.—A concentrate B of the following composition, the Concentrate A, and deionized water were mixed together to form the bath in the volume ratio of 3:3:4 respectively.

| Concentrate B: | G./l. |
|---|---|
| EDTA | 100.0 |
| NaOH | 46.8 |
| $Na_2CO_3$ | 14.4 |
| Methanol | 114.0 |
| Water | 778.5 |

Four salt shaker caps were electrolessly copper plated two caps at a time in each of the Control Bath and EDTA-Containing Baths for a 10 minute period for each two caps. The identical preplate cycle including sensitizing and activating was employed for all caps. The following results were noted:

Control bath 1A.—Complete coverage in 2–3 minutes with a continuous bright copper plate; bath stable after 9 days.

EDTA—Containing bath 1.—Skip plating; discontinuous, off color, non-bright, light brown copper plate; bath stable after 9 days.

EDTA—Containing bath 2.—Off color, non-bright, light brown copper plate; bath showed light seeding of copper in the fifth day of bath life.

EDTA—Containing bath 3.—Off color, non-bright, dark brown copper plate; bath showed heavy seeding of copper in the first day of bath life.

The importance of Rochelle salt as a constituent of the bath instead of the EDTA is shown by such test results.

Tests were also conducted to determine the effect of presence of an amine such as triethanolamine as a bath ingredient. For carrying out the tests, the following chemical reduction copper plating baths were prepared. The Concentrate A used in preparing all baths contained, by weight, 0.03% of $H_2SO_4$ (analytic reagent grade), 38.3% of HCHO (37% concentration), 7.1% of $CuSO_4 \cdot 5H_2O$ and 54.57% of water.

Control bath 1B.—A Concentrate B of the following composition, the Concentrate A, and deionized water were mixed together to form the bath in the volume ratio of 3:3:4 respectively.

| Concentrate B: | G./l. |
|---|---|
| Rochelle salt | 157.9 |
| NaOH | 46.8 |
| $Na_2CO_3$ | 14.4 |
| Methanol | 114.0 |
| Water | 778.5 |

Triethanolamine-containing bath.—A Concentrate B of the following composition, the Concentrate A, and deionized water were mixed together to form the bath in the volume ratio of 3:3:4 respectively.

Concentrate B:
- Rochelle salt—157.9 g./l.
- NaOH—46.8 g./l.
- $Na_2CO_3$—14.4 g./l.
- Methanol—114.0 g./l.
- Water—778.5 g./l.
- Triethanolamine—15 ml./l.

Four ABS salt shaker caps were electrolessly copper plated two caps at a time in each of the Control Bath 1B and Triethanolamine-Containing Bath for a 10 minute period for each two caps. The identical preplate cycle including sensitizing and activating was employed for all caps. The following results were obtained:

Control bath 1B.—Bath stable after 9 days of use. Continuous bright copper plate.

Triethanolamine-Containing bath.—Bath unstable with moderate seeding of the bath in the first day of the bath life, heavy seeding in the second day of bath life, and complete seed-out of the bath in the fifth day of bath life.

What is claimed is:

1. An electroless copper plating solution of improved stability comprising water, copper ions, formaldehyde as reducing agent for the copper ions, Rochelle salt as complexing agent for the copper ions, an alkali metal hydroxide from the group consisting of sodium hydroxide and potassium hydroxide, and additional methanol in amount to provide at least a 5% excess thereof over the amount of methanol required to stoichiometrically react with an alkali metal formate to form formaldehyde and an alkali metal hydroxide thereby to shift the equilibrium of the following reversible Cannizzaro side reaction $$\text{Alkali metal hydroxide} + 2HCHO \rightleftarrows \text{HCOOAlkali metal} + CH_3OH$$

wherein alkali metal is sodium or potassium, occurring in the solution in the direction of the reactants, the solution being free of an amine, the solution having a pH in the range of 10–13.

2. The solution of claim 1 further characterized by containing an alkali metal carbonate.

3. The solution of claim 1 characterized by the solution having a pH in the range of 11.5–12.5.

4. The solution of claim 1 wherein the alkali metal hydroxide is sodium hydroxide.

5. The solution of claim 1 wherein the additional methanol is that present in denatured alcohol.

6. A method for electrolessly copper plating a catalytic surface of an object, which comprises contacting the catalytic surface with an electroless copper plating solution comprising water, copper ions, formaldehyde as reducing agent for the copper ions, Rochelle salt as complexing agent for the copper ions, an alkali metal hydroxide from the group consisting of sodium hydroxide and potassium hydroxide, and additional methanol in amount to provide at least a 5% excess thereof over the amount of methanol required to stoichiometrically react with an alkali metal formate to form formaldehyde and an alkali metal hydroxide thereby to shift the equilibrium of the following reversible Cannizzaro side reaction $$\text{Alkali metal hydroxide} + 2HCHO \rightleftarrows \text{HCOOAlkali metal} + CH_3OH$$

wherein alkali metal is sodium or potassium, occurring in the solution in the direction of the reactants, the solution being free of an amine and having a pH in the range of 10–13.

7. The method of claim 6 wherein the contacting is by immersing the catalytic surface in the electroless copper plating solution.

8. The method of claim 6 wherein the catalytic surface to be plated is an activated non-metal surface.

9. The method of claim 6 wherein the catalytic surface to be plated is a catalytic metal surface.

10. The method of claim 8 wherein the activated non-metal surface is an activated plastic surface.

11. The method of claim 6 wherein the contacting is carried out at a solution temperature in the range from about 70° F.–140° F.

12. The method of claim 10 wherein the activated plastic surface is prepared by converting a hydrophobic plastic surface destined to be electrolessly copper plated to a hydrophilic surface, sensitizing the hydrophilic plastic surface by immersing the surface in an aqueous acid solution containing stannous chloride, and activating the surface by immersing the surface in an aqueous acid solution containing palladium chloride.

13. An electroless copper plating solution containing the following constituents in the proportions hereafter set forth:

Copper salt—20–30 g./l.
Rochelle salt—40–60 g./l.
Alkali metal hydroxide—10–20 g./l.
Formaldehyde (37%)—100–150 ml./l.
Methanol—from about 40–250 g./l.

14. A method for electrolessly copper plating a catalytic surface of an object which comprises contacting the catalytic surface with the electroless plating solution of claim 13.

References Cited

UNITED STATES PATENTS

| | | | |
|---|---|---|---|
| 2,903,403 | 9/1959 | Strauss | 117—50 |
| 2,924,534 | 2/1960 | Morse | 117—50 |
| 3,307,972 | 3/1967 | Ehrhardt | 106—1 |
| 3,415,666 | 12/1968 | Nagai et al. | 106—1 |
| 3,472,664 | 10/1969 | Bastenbeck | 106—1 |

ALFRED L. LEAVITT, Primary Examiner

J. A. BELL, Assistant Examiner

U.S. Cl. X.R.

117—50, 160; 106—1

PO-1050
(5/69)

UNITED STATES PATENT OFFICE
CERTIFICATE OF CORRECTION

Patent No. 3,595,684 Dated July 27, 1971

Inventor(s) John L. Morico and Howard W. Pender

It is certified that error appears in the above-identified patent and that said Letters Patent are hereby corrected as shown below:

Column 1, line 14, "is" should read --as--. Column 2, line 37, "certan pror" should read --certain prior--; line 28, "foramate" should read --formate--; line 39, "ntended" should read --intended--. Column 4, line 18, --quantities of methanol in the plating solution much-- should be inserted after "herein," and before "below"; last line, "pallidium" should read --palladium--. Column 6, line 40, delete "when". Column 7, line 28 --Art-- should be inserted after "Prior" and before "Plating". Column 8, line 53, "Soduim" should read --Sodium--. Column 9, line 20, "3:4:4" should read --3:3:4--.

Signed and sealed this 4th day of January 1972.

(SEAL)
Attest:

EDWARD M.FLETCHER,JR.
Attesting Officer

ROBERT GOTTSCHALK
Acting Commissioner of Patents